(12) United States Patent
Murofushi et al.

(10) Patent No.: US 7,923,738 B2
(45) Date of Patent: Apr. 12, 2011

(54) LED ARRAY FOR MICRODISPLAYS OR LIKE APPLICATION (75) Inventors: Hitoshi Murofushi, Saitama (JP); Koji Otsuka, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 12/265,887

(22) Filed: Nov. 6, 2008

(65) Prior Publication Data
US 2009/0121237 A1  May 14, 2009

(30) Foreign Application Priority Data

Nov. 9, 2007 (JP) ................. 2007-292542

(51) Int. Cl.
*H01L 29/18* (2006.01)
(52) U.S. Cl. .................. 257/88; 257/E33.066
(58) Field of Classification Search .................. 257/88, 257/E33.066
See application file for complete search history.

(56) References Cited

U.S. PATENT DOCUMENTS
4,241,281 A * 12/1980 Morimoto et al. ............ 315/161

FOREIGN PATENT DOCUMENTS
JP       2004-195946 A       7/2004

* cited by examiner

*Primary Examiner* — Evan Pert
*Assistant Examiner* — Matthew Reames
(74) *Attorney, Agent, or Firm* — Woodcock Washburn LLP (57) ABSTRACT An array of LEDs are grown by epitaxy on row-connecting conductor strips extending in parallel spaced relationship to one another on the surface of a semiconductor substrate and are thereby electrically interconnected in rows. The row-connecting conductor strips are formed by ion implantation of a p-type dopant into parts of an n-type silicon substrate. Column-connecting conductor strips extend over the light-emitting surfaces of the LEDs for electrically interconnecting them in columns. The LEDs are lit up individually by voltage application between one of the row-connecting conductor strips and one of the column-connecting conductor strips.

4 Claims, 5 Drawing Sheets

LED ARRAY FOR MICRODISPLAYS OR LIKE APPLICATION

CROSS REFERENCE TO RELATED APPLICATIONS

This application claims priority to Japanese Patent Application No. 2007-292542, filed Nov. 9, 2007.

BACKGROUND OF THE INVENTION

This invention relates generally to light-emitting semiconductor devices, or light-emitting diodes (LEDs) according to more common parlance, and particularly to those which lend themselves to use, by being arrayed, in small displays, now known as microdisplays, and in the printheads of LED printers, among other applications. The invention also specifically pertains to a method of fabricating such LED arrays.

Microdisplays and printheads incorporating an array of LEDs are now winning ever-increasing commercial acceptance. Generally, an LED array may be envisaged as a group of LEDs arranged in rows and columns on a substrate of electrically insulating or highly resistive material. The individual LEDs are electrically interconnected by conductors in a required pattern for individual excitation.

Among the materials that have been used for LED array substrates are sapphire, silicon carbide, and silicon. Both sapphire and silicon carbide permit layers of semiconducting compounds to be grown favorably thereon. Offsetting this benefit is their expensiveness, being considerably more costly than silicon. An additional drawback of sapphire and silicon carbide is that they are both more permeable to light, blue in particular, than is silicon. The light radiated by the LEDs toward the substrate may penetrate the same and hit its bottom, thereby to be diffusely reflected back through the neighboring LEDs (i.e., dots or pixels) and hence to leak out.

The silicon substrate has no such shortcomings. Besides being cheap, it is free from light leakage. Silicon is less in permeability to light than is sapphire or silicon carbide, so much so that the light from the LEDs is mostly absorbed by the substrate, with little or no leakage through the neighboring LEDs.

Japanese Unexamined Patent Publication No. 2004-195946 is hereby cited as dealing with an LED array on a high-resistance silicon substrate. The LEDs are each constituted of a first semiconductor layer of, say, n-type gallium arsenide (GaAs) and, thereover, a second semiconductor layer of, say, p-type GaAs for emission of light in response to voltage application to these constituent layers. The LEDs glow individually by having their first semiconductor layers electrically interconnected in rows or columns by first wires bonded to their surfaces, and their second semiconductor layers electrically interconnected in columns or rows by second wires bonded to their surfaces. The first semiconductor layers partly protrude from under the second semiconductor layers to provide ledges to which the first wires are bonded.

An objection to this known LED array is that the first semiconductor layers with their protruding ledges must themselves provide parts of the current paths to the LEDs. In order for the first semiconductor layers to perform this function to the full, they must be much thicker than in the case where they are coupled directly to the first wires or equivalent parts, without any such protruding parts. The thicker first semiconductor layers make the complete device correspondingly thicker. Additionally, the thicker first semiconductor layers add to the costs of the materials needed for their fabrication and to the lengths of time required for their epitaxial growth. Thus the prior art LED array was unnecessarily bulky and costly.

A further inconvenience with the prior art manifested itself when the first semiconductor layers of the LEDs were connected to one drive terminal. Such connection required the second wires to be branched at several points, necessitating highly complex LED wirings.

SUMMARY OF THE INVENTION

The present invention has it as an object to defeat the noted inconveniences in the art and provide a more compact, less expensive LED array or like light-emitting semiconductor device than the known devices of comparable design.

Stated in one aspect thereof, and perhaps in its simplest form, the invention concerns a light-emitting semiconductor device having a substrate made from a semiconductor of a first conductivity type. The substrate is partly doped into a first conductor strip of a second conductivity type, which is opposite to the noted first conductivity type. A plurality of LEDs are formed on the first conductor strip in the substrate and thereby electrically interconnected. A plurality of second conductor strips are electrically connected to the light-emitting surfaces, which are directed away from the substrate, of the LEDs. The LEDs may therefore be lit up individually by voltage application between the first conductor strip and any selected one of the second conductor strips.

An alternate construction is possible in which the substrate is doped in parts into a plurality of first conductor strips of the second conductivity type. At least one LED is formed on each of these first conductor strips in the substrate. A second conductor strip is electrically connected to the light-emitting surfaces of all the LEDs. The LEDs are thus capable of glowing independently by voltage application between any selected one of the first conductor strips and the second conductor strip.

A preferred embodiment of the invention disclosed herein takes the form of an LED array in which a semiconductor substrate of one conductivity type is doped in parts into a plurality of row-connecting conductor strips (first conductor strips) of opposite conductivity type extending in parallel spaced relationship to one another. LEDs are formed on the row-connecting conductor strips in the substrate and arranged in rows and columns, with each row of LEDs electrically interconnected by one of the row-connecting conductor strips. Each column of LEDs are interconnected by a column-connecting conductor strip (second conductor strip) extending over their light-emitting surfaces. Any selected one of the arrayed LEDs may therefore be lit up by voltage application between one of the row-connecting conductor strips and one of the column-connecting conductor strips.

The invention particularly features the first conductor strip or strips, which are an electroconductive semiconductor region or regions having a conductivity type opposite to that of the semiconductor substrate. Formed by epitaxy and subsequent etching, the LED or LEDs on the first conductor strip or strips are conventionally constituted of a first semiconductor layer of a first conductivity type overlying the first conductor strip, and a second semiconductor layer of a second conductivity type overlying the first semiconductor layer either directly or via an active layer. The first conductor strip or strips conduct current in a direction parallel to the substrate surface, and no such function is required for the lowermost first semiconductor layers of the LEDs directly overlying the first conductor strip or strips.

Contrastively, in the prior art LED array cited above, the first conductors extend over the lateral protuberances of the lowermost layers of the LEDs, instead of under the LEDs as in the instant invention. The lowermost LED layers of the prior art device were thus required solely to conduct current parallel to the substrate surface and so had to be inconveniently thick. The present invention assigns no such function to the lowermost LED layers. More precisely, according to the invention, the lowermost LED layers either need not at all conduct current parallel to the substrate surface or need not do so by themselves.

It is thus seen that the invention succeeds in making the lowermost LED layers, and in consequence the LEDs themselves and ultimately the complete device, thinner than heretofore. The manufacture of the device is also made easier and less costly.

The invention also makes the electrical connections of the LEDs easier and simpler. The LEDs are electrically connected on one hand by the first conductor strips built into the substrate and on the other hand by the second conductor strips extending thereover. The space requirements of the first conductor strips are virtually reduced to nil.

A further aspect of the invention a method of making the light-emitting semiconductor devices of the above summarized constructions. The method features the creation of the first conductor strip or strips in the semiconductor strip by doping. Ion implantation is particularly preferred for creation of the first conductor strip or strips electrically well separated from the rest of the substrate.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
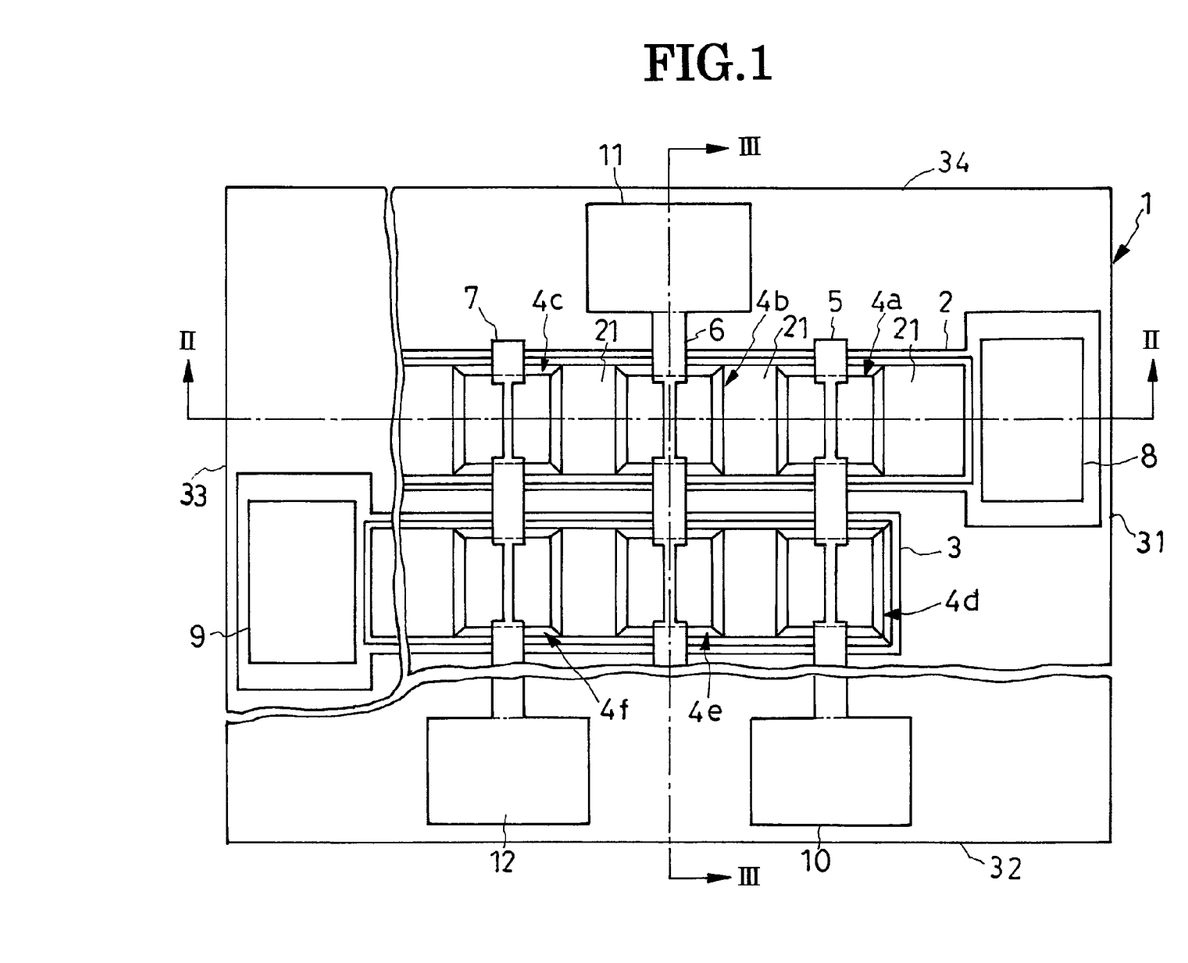
FIG. 1 is a diagrammatic plan view, partly broken away for illustrative convenience, of the LED array built upon the novel concepts of this invention, the view not showing an optically transparent, electrically insulating overlay of the LED array in order to reveal all the underlying parts.
Figure 2:
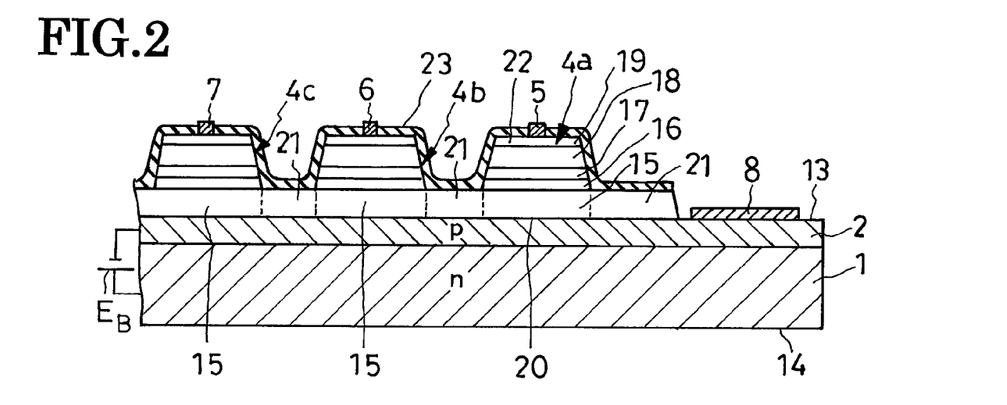
FIG. 2 is a section taken along the line II-II in FIG. 1.
Figure 3:
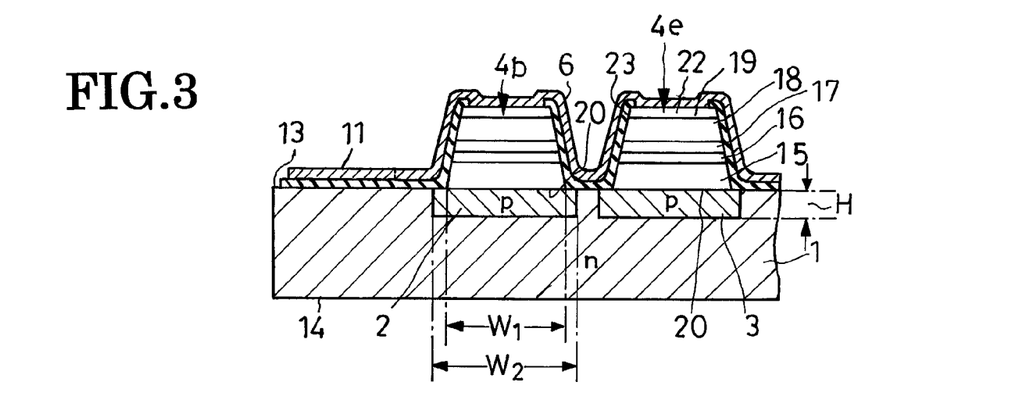
FIG. 3 is a section taken along the line III-III in FIG. 1.
Figure 4:
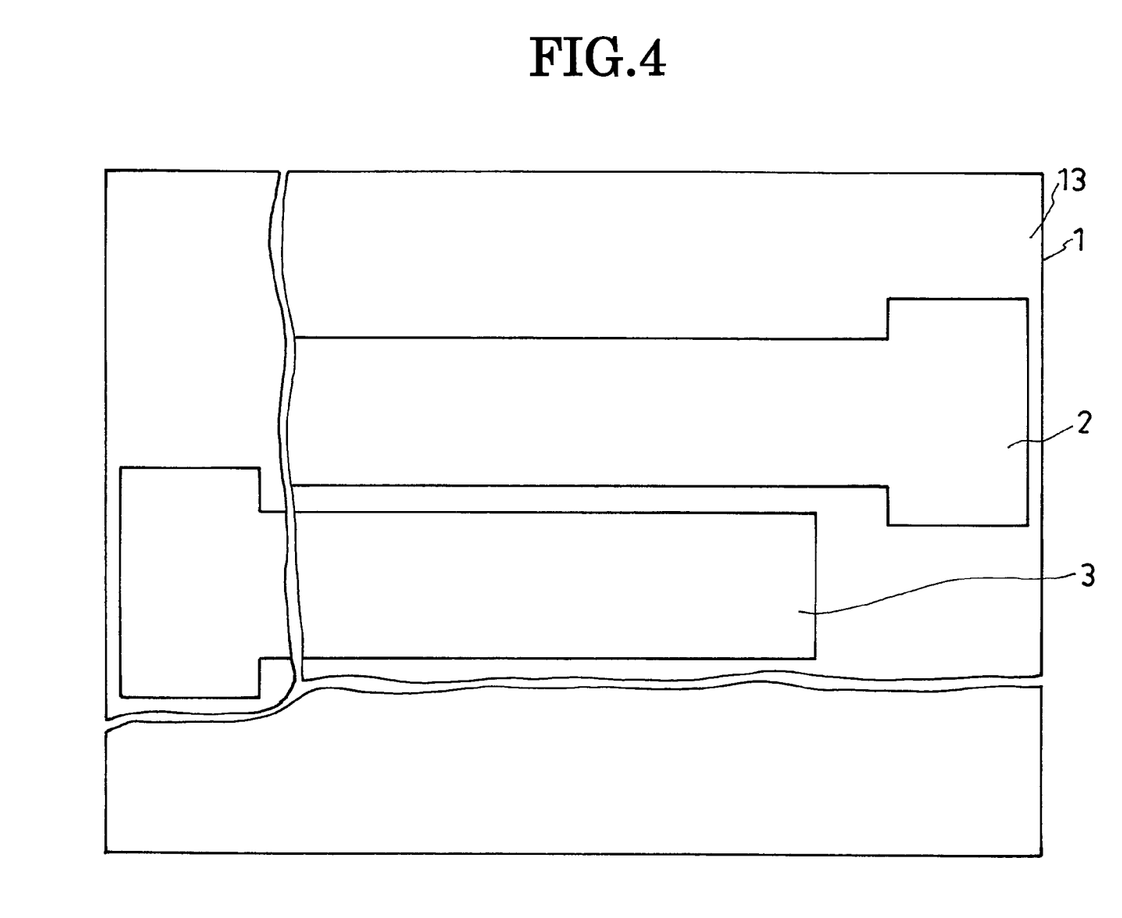
FIG. 4 is a diagrammatic plan view, partly broken away for illustrative convenience, of the semiconductor substrate, complete with the row-connecting conductor strips formed by partial doping therein, of the LED array of FIG. 1.

The LED array according to the present invention will now be described more specifically in terms of its first preferred form illustrated in FIGS. 1-5 of the above drawings. With particular reference to FIGS. 1-3 the representative LED array comprises:

1. A substrate 1 of semiconducting silicon.
2. A plurality of row-connecting conductor strips (first conductor strips), two shown in FIG. 1 and respectively designated 2 and 3, which, as depicted also in FIG. 4, are created by doping in the substrate 1, thereby forming integral parts of that substrate.
3. An array of LEDs including a first row of LEDs or light-emitting semiconductor regions, three shown at $4_a$, $4_b$ and $4_c$, which are formed on the first row-connecting conductor strip 2 thereby to be electrically interconnected, and a second row of LEDs or light-emitting semiconductor regions, also three shown at $4_d$, $4_e$ and $4_f$, which are formed on the second row-connecting conductor strip (second conductor strips) 3 thereby to be electrically interconnected.
4. A plurality of column-connecting conductor strips, three shown at 5, 6 and 7, electrically interconnecting respective columns of LEDs $4_a$-$4_f$.
5. A plurality of row terminals or bonding pads, two shown at 8 and 9 which are electrically coupled respectively to the row-connecting conductor strips 2 and 3.
6. A plurality of column terminals or bonding pads, three shown at 10, 11 and 12 which are electrically coupled respectively to the column-connecting conductor strips 5, 6 and 7.

Figure 5:
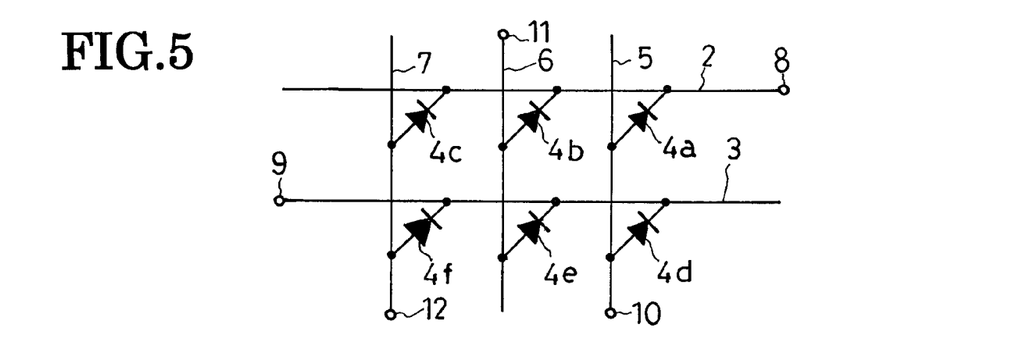
FIG. 5 is an equivalent electrical circuit diagram of the LED array of FIG. 1.

As equivalently diagramed in FIG. 5, the pixel-forming array of LEDs $4_a$-$4_f$ are each connected to one row-connecting conductor strip 2 or 3 on one hand and, on the other, to one column-connecting conductor strip 5, 6 or 7. The LED array is shown fragmentarily in FIGS. 1-5 for both illustrative and explanative convenience. It is understood that any required number of LEDs may be arrayed and electrically interconnected as herein disclosed.

Referring again to FIGS. 1-3, the substrate 1 is made from n-type silicon in this embodiment, with an n-type dopant concentration less than the p-type dopant concentration of the row-connecting conductor strips 2 and 3. The substrate 1 could, however, be of either p-type or undoped (intrinsic) silicon. Generally flat, the substrate 1 has a pair of opposite major surfaces 13 and 14. The LEDs $4_a$-$4_f$ are arrayed on one major surface 13 of the substrate 1. This substrate serves both as a basis for epitaxial growth of the constituent layers, to be detailed subsequently, of the LEDs $4_a$-$4_f$ and as a mechanical support for these LEDs. The substrate 1 may be 100-1000 micrometers thick.

As will be noted from FIGS. 1-4, the row-connecting conductor strips 2 and 3 extend in parallel spaced relationship to each other on the major surface 13 of the substrate 1. The first row-connecting conductor strip 2 is formed to include part on which the first row of LEDs $4_a$-$4_c$ are formed, part electrically interconnecting these LEDs, and part electrically connecting these LEDs to the first row terminal 8. The second row-connecting conductor strip 3 is likewise formed to include part on which the second row of LEDs $4_d$-$4_f$ are formed, part electrically interconnecting this second row of LEDs, and part electrically connecting the second row of LEDs to the second row terminal 9.

In this particular embodiment the row-connecting conductor strips or layers 2 and 3 are formed by ion implantation, a kind of doping, of a p-type dopant (e.g., boron) into the required parts of the major surface 13 of the substrate 1 to a concentration of $1\times10^{19}$ cm$^{-3}$ or so. The row-connecting conductor strips 2 and 3 are therefore opposite in conductivity type to the substrate 1 and so much less in resistivity (e.g., 0.01-1.00 ohm-centimeter) that they are herein called conductors. Further the row-connecting conductor strips 2 and 3 have a depth H, FIG. 3, (e.g., five to twenty micrometers) that is sufficient for them to provide paths of drive current for the LEDs $4_a$-$4_f$.

The p-type row-connecting conductor strips 2 and 3 are electrically isolated from the n-type substrate 1 by the p-n junctions therebetween. Further, in order to make sure this electrical separation by the p-n junctions, a reverse bias voltage source $E_a$, FIG. 2, has its opposite polarity terminals connected respectively to the substrate 1 and each of the row-connecting conductor strips 2 and 3. The electrical isolation of the individual row-connecting conductor strips 2 and 3 from the substrate 1 is essential for their desired functioning as drive current paths for the LEDs $4_a$-$4_f$, with practically no current leakage to the substrate.

As will be observed from FIG. 3, which is a section taken along the line III-III in FIG. 1, the width $W_2$ of each of the row-connecting conductor strips 2 and 3 is somewhat more than the dimension $W_1$ of each of the LEDs $4_a$-$4_f$ taken in the same direction. Speaking more broadly, however, the row-connecting conductor strips 2 and 3 may be of any width as long as they can conduct current to the respective rows of LEDs. Thus, if electrically separated from the substrate 1 by means other than the p-n junctions, these conductor strips 2 and 3 might even be narrower than the LEDs. A problem in this case, however, is that protuberances would be unavoidably created at the boundaries between the substrate 1 and the conductor strips 2 and 3 when the latter were formed in the former by ion implantation of a conductivity type determinant. When the LEDs are subsequently grown on the substrate 1, their constituent layers would suffer in crystallinity on the protuberant boundaries between the substrate 1 and the conductor strips 2 and 3. It is therefore desirable that the row-connecting conductor strips 2 and 3 be made wider than the LEDs $4_a$-$4_f$ so that the latter may be placed clear of the noted boundaries.

The row-connecting conductor strips 2 and 3 have terminal enlargements on which there are formed the row terminals or bonding pads 8 and 9, one for each strip. The row terminals 8 and 9 are each in the form of sheet metal, to which wires, not shown, may be bonded for connection to external circuitry.

FIG. 1 indicates that the row terminals 8 and 9, and others not shown here, are arranged alternately, or staggered, along the pair of opposite sides 31 and 33 of the substrate 1. The neighboring row terminals along each of these substrate sides are therefore spaced more greatly from each other than if all the terminals were aligned along either side of the substrate. Staggered as depicted here, the row terminals can be made greater in a dimension along the substrate side 31 or 33 than each row-connecting conductor strip 2 or 3, while being sufficiently electrically separated from one another. The alternate arrangement of the row terminals 8 and 9 along the opposite sides 31 and 33 of the substrate 1 is not a requirement; instead, they may all be disposed along either side of the substrate in cases where they need not be much wider than the row-connecting conductor strips 2 and 3.

All the LEDs $4_a$-$4_f$ shown in FIG. 1 are, as better illustrated in FIGS. 2 and 3, each constituted of an n-type buffer 15, an n-type semiconductor layer 16, an active layer 17, and a p-type semiconductor layer 18, arranged in that order from the bottom upward. The p-type semiconductor layer 18 provides a top surface 19 of each LED from which issues the light from the active layer 17. The buffer 15 on the other hand provides a bottom surface 20 which is held against the row-connecting conductor strip 2 or 3. Thus the first row of LEDs $4_a$-$4_c$ all have their buffers 15 electrically connected to the first row-connecting conductor strip 2, and so do the second row of LEDs $4_d$-$4_f$ all have their buffers 15 electrically connected to the second row-connecting conductor strip 3.

Typically, the buffer 15 of each LED is a lamination of alternating n-doped aluminum nitride (AlN) layer and n-doped gallium nitride (GaN) layer. Each AlN layer may be 0.5-5.0 nanometers thick, and each GaN layer 5-5500 nanometers thick. Instead of AlN there may be employed either aluminum indium nitride (AlInN), aluminum gallium nitride (AlGaN), or aluminum indium gallium nitride (AlInGaN), and instead of GaN either indium gallium nitride (InGaN), aluminum indium nitride (AlInN), aluminum gallium nitride (AlGaN), or aluminum indium gallium nitride (AlInGaN). As a further alternative the buffer 15 may be a single layer of a semiconducting nitride such as aluminum nitride or gallium nitride. It is even possible to eliminate the buffer 15 altogether. Furthermore, being of the same conductivity type as the overlying n-type semiconductor layer 16, the buffer might be considered part of that layer.

The row-connecting conductor strips 2 and 3 of p-type silicon are in contact with the n-type buffers 15 of the LEDs $4_a$-$4_f$ in this embodiment. When a forward voltage is impressed to the LEDs $4_a$-$4_f$, these heterojunctions, with the usual alloyed regions therebetween, will cause a less voltage drop than in the case of n-type silicon and n-type buffers. Should n-type buffers of semiconducting nitride such as GaN be formed on n-type silicon conductor strips, Ga or other Group III elements contained in the nitride would act as p-type impurity on the n-type silicon strips, thereby creating p-n junctions. A voltage drop would occur across these p-n junctions, but only to such a degree that no particular inconvenience would arise. The row-connecting conductor strips 2 and 3 may therefore be of an n-type silicon within the scope of the invention. The substrate 1 may then be of p-type silicon for electrically separating the row-connecting conductor strips 2 and 3 from the substrate by p-n junctions.

As seen in FIG. 1, and perhaps as better indicated by the dashed lines in FIG. 2, the buffers 15 of the first row of LEDs $4_a$-$4_c$ are formed in one piece, and in alternation, with low resistance conductor regions 21 on the first row-connecting conductor strip 2. The buffers 15 of the second row of LEDs $4_d$-$4_f$ are likewise formed in one piece, and in alternation, with similar low resistance conductor regions 21 on the second row-connecting conductor strip 3. These low resistance conductor regions 21 are intended to add to the conductivity of the underlying row-connecting conductor strips 2 and 3. Disposed out of register with the LEDs $4_a$-$4_f$, the low resistance conductor regions 21 has no current flow in their thickness direction but only in a direction at right angles therewith. Electrically, the low resistance conductor regions 21 might be described as being in parallel connection with the underlying row-connecting conductor strip 2 or 3. The overall resistance of the row-connecting conductor strip 2 or 3 and the low resistance conductor regions 21 thereon is less than in the absence of these low resistance conductor regions.

The low resistance conductor regions 21 will be unnecessary if the row-connecting conductor strips 2 and 3 are sufficiently low in resistance. It will nevertheless be appreciated that, occupying the otherwise unused spaces over the row-connecting conductor strips 2 and 3 and between the buffers 15 of the LEDs $4_a$-$4_f$, the low resistance conductor regions 21 do not in any way add to the size of the LED array. An additional advantage is that the low resistance conductor regions 21 are fabricated from the same material and at the same time with the buffers 15 of the LEDs $4_a$-$4_f$. Alternatively, however, the low resistance conductor regions 21 may be made from the same materials as the buffers 15 and n-type semiconductor layers 16 thereon, from metal for further reduction of resistance, or from a semiconductor material different from that of the buffers 15. The buffers 15 and low resistance conductor regions 21 are both made as aforesaid from alternating n-doped AlN and n-doped GaN layers in this embodiment, with consequent creation of two-dimensional electron gas at the heterojunctions. The low resistance conductor regions 21 are therefore low in resistance in their longitudinal direction.

The n-type semiconductor layer 16, known also as the lower cladding of the active layer 17, of the LEDs $4_a$-$4_f$ is made from an n-type semiconducting nitride, preferably GaN, with a bandgap greater than that of the active layer 17. Other compounds adoptable for this n-type semiconductor layer 16 include AlInGaN and AlGaN.

Interposed between n-type semiconductor 16 and p-type semiconductor layer 18 to provide a double-heterojunction LED, the active layer 17 of the LEDs $4_a$-$4_f$ is made from a semiconducting nitride such as InGaN. A multiple quantum well (MQW) structure is a preferred design of the active layer 17, but it might also be a single quantum well (SQW) or a single semiconductor layer. It is even possible to omit the active layer 17 and place the n- and p-type semiconductor layers 16 and 18 in direct contact with each other.

The p-type semiconductor layer 18, or upper cladding, of the LEDs $4_a$-$4_f$ is made from a p-type semiconducting nitride such as GaN, with a bandgap greater than that of the active layer 17. Other compound semiconductors such as AlInGaN and AlGaN are also adoptable for this layer 18.

Both FIGS. 2 and 3 reveal at 22 a known current-spreading film or transparent conducting film covering the light-emitting surface 19 of each of the LEDs $4_a$-$4_f$ in low-resistance (ohmic) contact with the p-type semiconductor layer 18. Made from indium tin oxide (ITO), for instance, the current-spreading film 22 is intended for a more uniform current distribution throughout each LED. The current-spreading film 22 is not essential, however, so it is omissible in those applications of the invention where a uniformity of current flow through each LED is not a top priority.

As will be noted from all of FIGS. 1-3, each of the LEDs $4_a$-$4_f$ tapers as it extends upwardly, with all its four sides at an angle to the top surface 13 of the substrate 1. Specifically, the angle of the four sides of the LEDs $4_a$-$4_f$ may be more than 75 degrees and less than 90 degrees with respect to the substrate surface 13 in order to prevent the lateral radiations of light from each LED from irradiating the neighboring LEDs.

For fabricating the LEDs $4_a$-$4_f$ the row-connecting conductor strips 2 and 3 may first be built into the substrate 1 by ion implantation or the like. The layers to be later separated into the constituent layers 15-18 of the LEDs $4_a$-$4_f$ may then be deposited one after another, as by metalorganic chemical vapor deposition (MOCVD), on the surface 13 of the substrate 1. Then an ITO layer to be separated into the current-spreading films 22 on the LEDs may be vapor deposited on the LED layers. Then all the layers on the substrate surface 13 may be etched through an etchant-resist mask, leaving the array of LEDs $4_a$-$4_f$ and the rows of low resistance conductor regions 21 on the row-connecting conductor strips 2 and 3 in the substrate.

At 23 in both FIGS. 2 and 3 is seen a protective overlay 23 of optically transparent, electrically insulating material. The protective overlay 23 covers all the exposed surfaces of the LEDs $4_a$-$4_f$, low-resistance conductor regions 21, row-connecting conductor strips 2 and 3, and substrate 1. The protective overlay 23 may be made from $SiO_x$ where the subscript x is a numeral in the range of 1-2. FIG. 1 does not show the protective overlay in order to reveal all the underlying parts.

Made from metal, preferably gold, the column-connecting conductor strips 5-7 extend in parallel spaced relationship to one another over the respective columns of LEDs $4_a$-$4_f$. A closer inspection of FIGS. 2 and 3 will make it clear that the protective overlay 23 is slitted over the LEDs $4_a$-$4_f$ to reveal parts of the current-spreading films 22. The column-connecting conductor strips 5-7 are received in these slits in the protective overlay 23 into electrical contact with the current-spreading films 22 of the LEDs $4_a$-$4_b$. The column-connecting conductor strips 5-7 are constricted at their parts received in the slits in the protective overlay 23 for minimal interference with light emission from the LEDs $4_a$-$4_f$. Since the current-spreading films 22 are optional as aforesaid, the column-connecting conductor strips 5-7 might be placed in low resistance contact with the light-emitting surfaces 19 of the LEDs $4_a$-$4_f$ in the absence of the current-spreading films.

Just as the row-connecting conductor strips 2 and 3 electrically interconnect the LEDs $4_a$-$4_f$ in rows, so the column-connecting conductor strips 5-7 electrically interconnect the LEDs in columns, thereby making all the LEDs arrayed electrically, besides being arrayed physically. To be more specific, the first column-connecting conductor strip 5 is electrically connected both to the first LED $4_a$ on the first row-connecting conductor strip 2 and to the first LED $4_d$ on the second row-connecting conductor strip 3. The second column-connecting conductor strip 6 is electrically connected both to the second LED $4_b$ on the first row-connecting conductor strip 2 and to the second LED $4_e$ on the second row-connecting conductor strip 3. The third column-connecting conductor strip 7 is electrically connected both to the third LED $4_c$ on the first row-connecting conductor strip 2 and to the third LED $4_f$ on the second row-connecting conductor strip 3.

The illustrated three column terminals or bonding pads 10-12 are formed on the protective overlay 23 and joined directly to the respective column-connecting conductor strips 5-7. The column terminals 10-12 are made from sheet metal (gold), each in one piece with one of the column-connecting conductor strips 5-7 in this embodiment, so that the boundaries between the strips 5-7 and terminals 10-12 are indicated by the broken lines. Different conducting materials may be employed for the column-connecting conductor strips 5-7 and column terminals 10-12 only if they are electrically coupled together.

Just as the row terminals 8 and 9 are staggered along the pair of opposite sides 31 and 33 of the substrate 1, so are the column terminals 10-12 staggered along the pair of opposite sides 32 and 34 of the substrate. The column terminals 10-12 are thus spaced longer distances away from each other, and/or made greater in a dimension parallel to the row-connecting strips 2 and 3, than in the case where all the column terminals 10-12 are aligned along either side of the substrate 1.

Mechanically configured as pictured in FIGS. 1-3 and electrically interconnected as diagramed in FIG. 5, the array of LEDs $4_a$-$4_f$ are capable of individual, selective excitation. To this end a drive voltage may be selectively impressed between one of the row-connecting conductor strips 2 and 3 and one of the column-connecting conductor strips 5-7 while at the same time a reverse bias voltage is applied between substrate 1 and row-connecting conductor strips 2 and 3.

For example, if the first LED $4_a$ is to be lit up, a drive voltage may be impressed between first row terminal 8 and first column terminal 10 while a reverse bias is applied between substrate 1 and row-connecting conductor strips 2 and 3. The first LED $4_a$ will glow as then the drive current flows along the path comprising the first column terminal 10, first column-connecting conductor strip 5, first LED $4_a$, first row-connecting conductor strip 2, and first row terminal 8. It is considered self-evident that all the other LEDs $4_b$-$4_f$ can be each excited in a like manner.

The benefits offered by the above described embodiment of the invention may be recapitulated as follows:

1. The rows of LEDs $4_a$-$4_f$ are formed on, and electrically coupled to, the respective row-connecting conductor strips 2 and 3 which have been preformed in the substrate 1 by doping. This interconnection of each row of LEDs totally differs from that which is taught by the aforesaid Japanese Unexamined Patent Publication No. 2004-195946, in which the LEDs have their lowermost layers protruding laterally therefrom to provide ledges to which interconnecting wires are joined. This prior art construction requires the protruding ledges to conduct the whole drive current, so that the lowermost layers of the LEDs with their protruding edges must be sufficiently thick to serve that purpose. By contrast, in this embodiment of the invention, each row of LEDs have their lowermost buffers 15 formed in direct electrical contact with one of the row-connecting conducting strips 2 and 3 which are integrally built into the substrate 1. Being no indispensable parts of the conductor strips 2 and 3, the buffers 15 and of course the LEDs themselves can be made thinner than in the prior art. An additional benefit is a reduction of the on-resistance of the LEDs.

2. The LEDs $4_a$-$4_f$ are automatically electrically interconnected by the row-connecting conductor strips 2 and 3 on being formed in prescribed positions on the substrate 1. The LEDs need not have any protruding parts for their interconnection and so can be placed closer together on a smaller substrate.

3. The LEDs $4_a$-$4_f$ have their crystallinity unimpaired on being grown on the row-connecting conductor strips 2 and 3, each conductor strip having a width $W_2$, FIG. 3, greater than the corresponding dimension $W_1$ of each LED. Created by ion implantation, the row-connecting conductor strips 2 and 3 will unavoidable give rise to minute protuberances along their boundaries. These minute protuberances are known to do harm to the crystallinity of the layers grown by epitaxy thereon. The LEDs have no parts overlying such protuberances and so are better in performance characteristics.

4. Arranged alternately with the buffers 15 of the LEDs $4_a$-$4_f$, the low resistance conductor regions 21 add to the conductivity of the row-connecting conductor strips 2 and 3.

5. Each row of LEDs $4_a$-$4_c$ and $4_d$-$4_f$ are automatically electrically connected to each other and to one of the row terminals 8 and 9 merely by being formed on one of the row-connecting conductor strips 2 and 3. No extra means or extra manufacturing steps are needed for such connections.

6. The row terminals 8 and 9 are staggered along the pair of opposite sides 31 and 33 of the substrate 1. Consequently, not only are the row terminals better electrically separated from one another but can be made larger in size for greater ease of connection to external circuitry.

7. The column terminals 10-12 are also better electrically separated from one another by being staggered along the pair of opposite sides 32 and 34 of the substrate 1. These terminals can also be made larger in size for greater ease of connection to external circuitry.

8. The LEDs $4_a$-$4_f$ lie at the intersections of the row-connecting conductor strips 2 and 3 and column-connecting conductor strips 5-7, thereby serving the additional purpose of positively electrically separating these strips from each other.

9. Being wider as aforesaid than the LEDs $4_a$-$4_f$, the row-connecting conductor strips 2 and 3 have each a pair of opposite longitudinal edge portions protruding from under the LEDs. These protruding edge portions of the row-connecting conductor strips are electrically separated from the overlying column-connecting conductor strips 5-7 by the overlay 23 of optically transparent, electrically insulating material. There is little or no likelihood of the overlay 23 failing to electrically separate the row-connecting conductor strips 2-3 from the column-connecting conductor strips 5-7, so small being the parts of these conductor strips that are separated solely by the overlay 23.

10. Made from silicon, the substrate 1 is less permeable to the light generated by the semiconducting nitride LEDs $4_a$-$4_f$ than that made from sapphire or silicon carbide. There is therefore less light from each LED reflected from the bottom 14 of the substrate 1 and leaking out through the neighboring LEDs.

Figure 6:
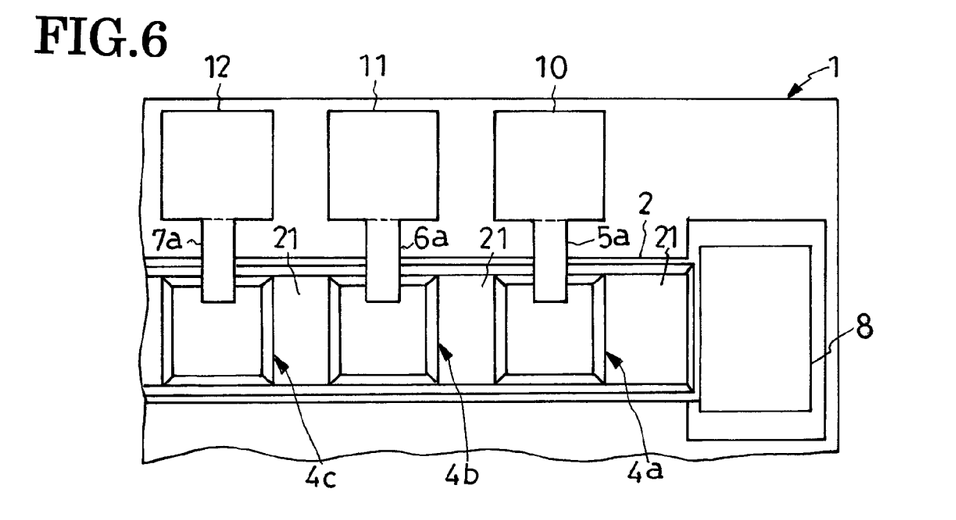
FIG. 6 is a fragmentary plan view of another preferred embodiment of the invention.

Embodiment of FIG. 6

A plurality of LEDs, three shown at $4_a$, $4_b$ and $4_c$ are here aligned in one row on the row-connecting conductor strip 2 in the substrate 1. There are as many column-connecting conductor strips $5_a$-$7_a$ as there are LEDs $4_a$-$4_c$. The column-connecting conductor strips $5_a$-$7_a$ are electrically connected each to one of the LEDs $4_a$-$4_c$, unlike the prior art in which each column-connecting conductor strip electrically interconnects a plurality of LEDs in a column.

The row of LEDs $4_a$-$4_c$ are all electrically interconnected by the row-connecting conductor strip 2 as in the first disclosed embodiment. The row-connecting conductor strip 2 is a p-doped semiconductor region in the n-type silicon substrate 1, with a width greater than the corresponding dimension of each LED. The LEDs $4_a$-$4_c$ alternate with the low resistance conductor regions 21 on the row-connecting conductor strip 2.

The row of LEDs $4_a$-$4_b$ are all electrically connected to the row terminal 8 via the row-connecting conductor strip 2 and to the respective column terminals 10-12 via the column-connecting conductor strips $5_a$-$7_a$. Any one of these LEDs may therefore be excited by voltage application between the row terminal 8 and one of the column terminals 10-12.

This embodiment is meant to demonstrate that any desired number of LEDs may be arranged in a row and electrically connected by the principles of this invention. It will also be apparent that this unitary row of LEDs may be combined with one or more other similar rows of LEDs on one and the same substrate.

Figure 7:
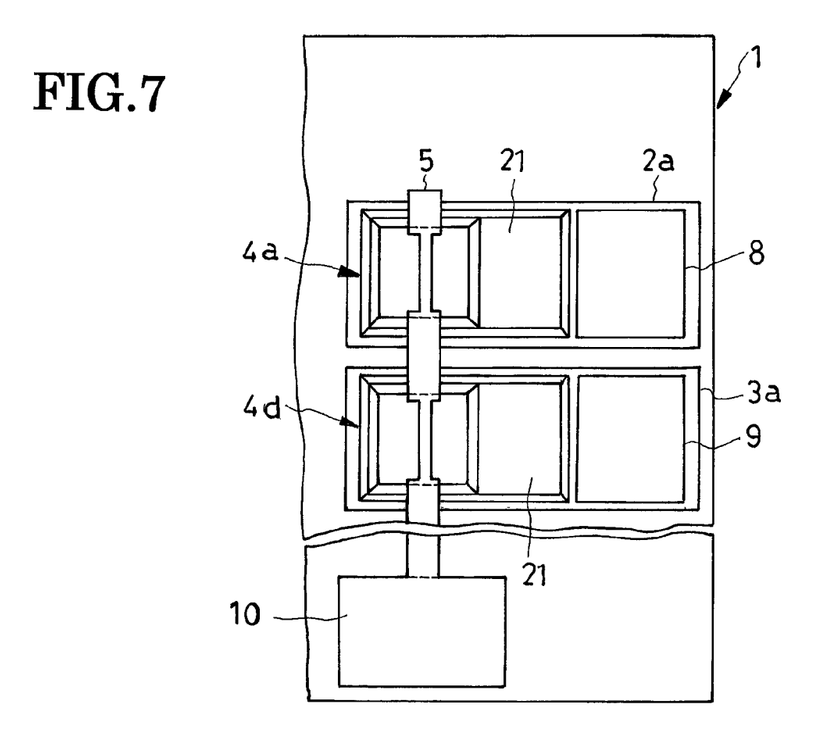
FIG. 7 is a fragmentary plan view of still another preferred embodiment of the invention.

Embodiment of FIG. 7

The first row-connecting conductor strip $2_a$ is here used to connect but one LED $4_a$ to the first row terminal 8, and the second row-connecting conductor $3_a$ to connect one other LED $4_d$ to the second row terminal 9. The other details of construction are substantially as above described with reference to FIGS. 1-5.

Like their counterparts 2 and 3 of the first disclosed embodiment, the row-connecting conductor strips $2_a$ and $3_a$ are created in the n-type silicon substrate 1 by partial doping of a p-type impurity, each to a width greater than the corresponding dimension of the overlying LED $4_a$ or $4_d$. The row-connecting conductor strips $2_a$ and $3_a$ electrically connect the LEDs $4_a$ and $4_d$ to the respective row terminals 8 and 9. The low resistance conductor regions 21 are interposed between the LEDs $4_a$ and $4_d$ and the row terminals 8 and 9, in direct electrical contact with the row-connecting conductor strips $2_a$ and $3_a$. The column-connecting conductor strip 5 extends over the LEDs $4_a$ and $4_d$, electrically connecting them to the column terminal 10.

A drive voltage may be impressed between row terminal 8 and column terminal 10 in order to light up the first LED $4_a$, and between row terminal 9 and column terminal 10 in order to light up the second LED $4_b$.

It is understood that any desired number of LEDs may be aligned in a column, electrically connected to the respective row terminals via the respective row-connecting conductor strips, and electrically to a common column terminal via a single column-connecting conductor strip. Furthermore, any desired number of such LED columns may be combined into an array embodying the invention.

Figure 8:
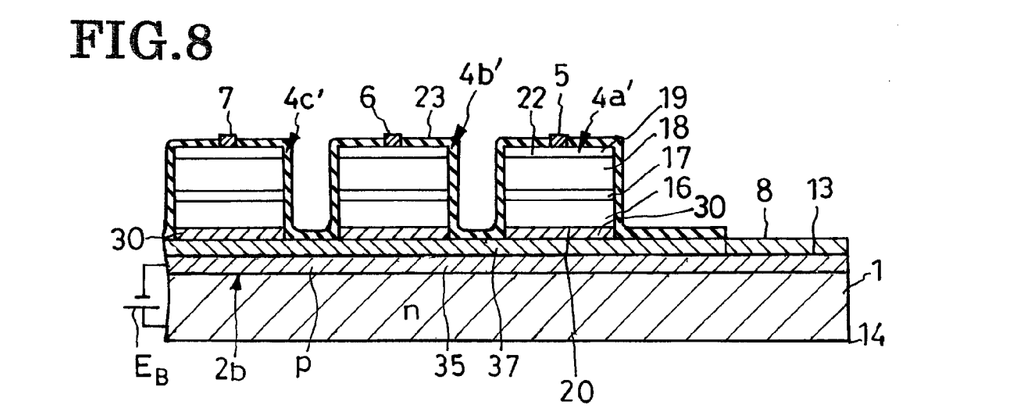
FIG. 8 is a view similar to FIG. 2 but showing a further preferred embodiment of the invention.
Figure 9:
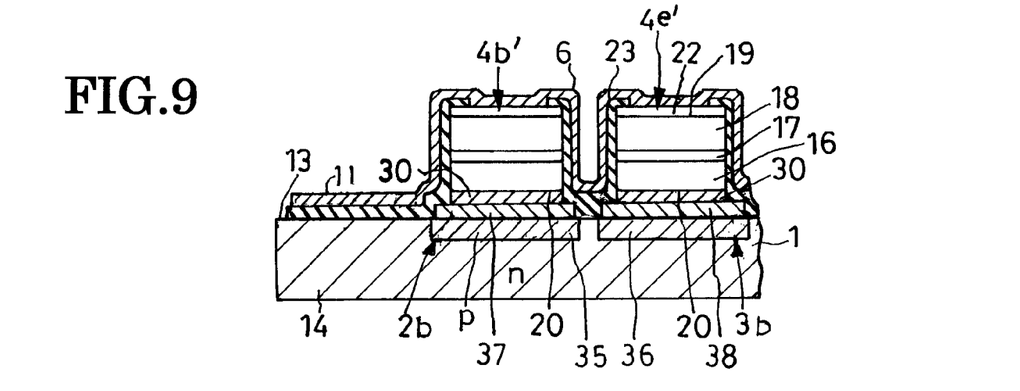
FIG. 9 is a view similar to FIG. 3 but showing the embodiment of FIG. 8.

Embodiment of FIGS. 8 and 9

This embodiment features modified row-connecting conductor strips $2_b$ and $3_b$ and a modified array of LEDs, of which only four are seen at $4_a'$, $4_b'$, $4_c'$ and $4_e'$ for illustrative convenience. All the other details of construction are as previously set forth in conjunction with the first disclosed embodiment.

The modified row-connecting conductor strips $2_b$ and $3_b$ include, in addition to electroconductive p-type semiconductor layers 35 and 36 formed in the substrate 1, sheet-metal layers 37 and 38 superposed upon the respective semiconductor layers 35 and 36. Like the row-connecting conductor strips 2 and 3 of the first disclosed embodiment, the p-type semiconductor layers 35 and 36 of the modified row-connecting conductor strips $2_b$ and $3_b$ are formed by partial doping of the substrate 1 with a p-type impurity. Laid over these p-type semiconductor layers 35 and 36, the metal-metal layers 37 and 38 may be of one-piece construction with the row terminals such as the one seen at 8. The p-type semiconductor layers 35 and 36 have parts underlying the row terminals.

The modified LEDs $4_a$, $4_b$, ... differ from their counterparts in FIGS. 1-3 in having no buffer and in having their sides at right angles with the substrate surface 13. These LEDs are connected, both mechanically and electrically, to the sheet-metal layers 37 and 38 of the row-connecting conductor strips $2_b$ and $3_b$ via bonding metal layers 30. Thus, thanks to the sheet-metal layers 37 and 38 of the row-connecting conductor strips $2_b$ and $3_b$, the rows of LEDs are electrically connected to the respective row terminals with less resistance than in the first disclosed embodiment.

Figure 10:
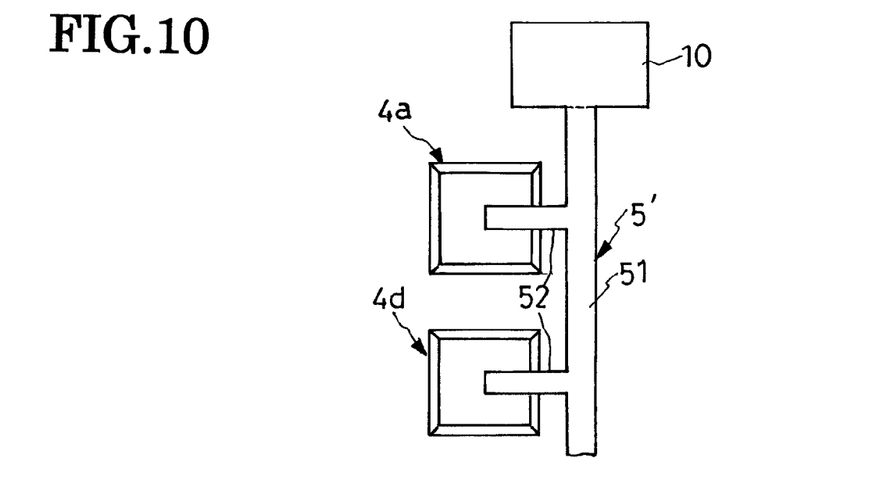
FIG. 10 is a plan view of a modified column-connecting conductor strip which may be employed in any of the foregoing embodiments.

Embodiment of FIG. 10

The column-connecting conductor strips of the foregoing embodiments, such as those designated 5-7 in FIGS. 1-3, are modifiable as represented by that illustrated in FIG. 10 and therein generally labeled 5'. The modified column-connecting conductor strip 5' has a main strip 51 extending alongside each column of LEDs such as those designated $4_a$ and $4_d$ and branches 52 extending laterally from the main strip 51 into electrical connection with the respective LEDs. The main strip 51 of the column-connecting conductor strip 5' terminates in the column terminal 10.

The branched column-connecting conductor strips will occupy less part of the light-emitting surfaces of the LEDs for electrical connection thereto. At least technically, the row-connecting conductor strips such as those seen at 2 and 3 in FIGS. 1-3 are likewise modifiable.

Possible Modifications

Notwithstanding the foregoing detailed disclosure it is not desired that the present invention be limited by the exact showing of the drawings or the description thereof. The following is a brief list of possible modifications, alterations or adaptations of the illustrated embodiments which are all believed to fall within the purview of the invention:

1. The LEDs in an array may be excited either individually, as in the embodiments disclosed herein, or in preselected groups of two or more.
2. Red, green, and blue LEDs may be put to combined use as taught by the invention for color display.
3. The row-connecting conductor strips $2_b$ and $3_b$ of the FIGS. 8 and 9 embodiment are applicable to the embodiments of FIGS. 6 and 7.
4. The substrate 1, row-connecting conductor strips 2 and 3, and semiconductor layers 35 and 36 of the row-connecting conductor strips $2_b$ and $3_b$ could be made from semiconductors other than silicon, such as compound semiconductors.
5. All or some of the LEDs in an array could be made from substances other than nitride semiconductors, examples being gallium-based compound semiconductors such as GaAs and AlGaAs.
6. The low resistance conductor regions 21, disposed alternately with each row of LEDs, could be formed not solely by extensions of the buffers 15 of the LEDs but by extensions of both buffers 15 and n-type semiconductor layers 16 of the LEDs. Further, in the absence of the buffers 15, the low resistance conductor regions 21 could be formed by extensions of the n-type semiconductor layers 16.
7. The column terminals 10-12 could directly overlie the substrate 1.
8. When made from semiconducting nitrides, the LEDs $4_a$-$4_f$ may have their sides at an angle of 75-90 degrees with respect to the substrate surface in order to cause lateral emissions of light to be absorbed by the substrate with a minimum of leakage to the neighboring parts.

What is claimed is:
1. A light-emitting semiconductor device comprising:
(a) a substrate made from a semiconductor having a first conductivity type, the substrate having a pair of opposite sides;
(b) a plurality of row-connecting strips formed in, and constituting integral parts of, the substrate and having a second conductivity type opposite to the first conductivity type;
(c) a plurality of LEDs formed on the row-connecting conductor strips in the substrate and arranged in rows and columns, each row of LEDs being electrically interconnected by one of the row-connecting conductor strips, each LED having a light-emitting surface facing away from the substrate;
(d) a plurality of column-connecting conductor strips each extending over the light-emitting surfaces of one column of LEDs for electrically interconnecting them; and
(e) a plurality of row terminals formed on the row-connecting conductor strips for connection to external circuitry, the row terminals being arranged alternately along the pair of opposite sides of the substrate, whereby the LEDs are lit up individually by voltage application between one of the row-connecting conductor strips and one of the column-connecting conductor strips.

2. A light-emitting semiconductor device as defined in claim 1, wherein the row-connecting conductor strips have formed thereon a plurality of low resistance conductor region in alternation with the LEDs in order to add to the conductivity of the row-connecting conductor strips.

3. A light-emitting semiconductor device as defined in claim 2, wherein the low resistance conductor regions on the row-connecting conductor strips are of the same material as at least one constituent layer of each LED thereon.

4. A light-emitting semiconductor device as defined in claim 1, further comprising sheet metal layers overlying the row connecting conductor strips, the LEDs being formed on the row-connecting conductor strips via the sheet metal layers.

* * * * *